US006573977B1

United States Patent
Mori

(10) Patent No.: US 6,573,977 B1
(45) Date of Patent: Jun. 3, 2003

(54) EXPOSURE CONTROL METHOD, EXPOSURE APPARATUS AND DEVICE MANUFACTURING METHOD

(75) Inventor: Kenichiro Mori, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/534,126

(22) Filed: Mar. 23, 2000

(30) Foreign Application Priority Data

Mar. 24, 1999 (JP) ............................................ 11-079951

(51) Int. Cl.[7] ...................... G03B 27/72; G03B 27/54; G03B 27/42

(52) U.S. Cl. .............................. 355/69; 355/53; 355/67

(58) Field of Search ............................... 355/35, 53, 67, 355/69, 71, 77; 250/205, 492.2

(56) References Cited

U.S. PATENT DOCUMENTS

| 5,107,275 A | * | 4/1992 | Tsuruoka et al. ........... 347/247 |
| 6,337,734 B1 | * | 1/2002 | Mori ........................... 355/53 |
| 2001/0028448 A1 | * | 10/2001 | Mori ........................... 355/55 |

* cited by examiner

*Primary Examiner*—Rodney Fuller
(74) *Attorney, Agent, or Firm*—Fitzpatrick, Cella, Harper & Scinto

(57) ABSTRACT

A method of controlling an amount of exposure, in which, when a pattern on a reticle is illuminated by illuminating light from a light source so as to be projected onto a substrate, an amount of light at a position substantially conjugate with a projected area on the substrate is measured and an amount of exposure applied to the substrate is controlled based upon a result of this measurement. The position at which the amount of light is measured is a position substantially conjugate with an off-optical-axis position in the projected area on the substrate.

17 Claims, 13 Drawing Sheets

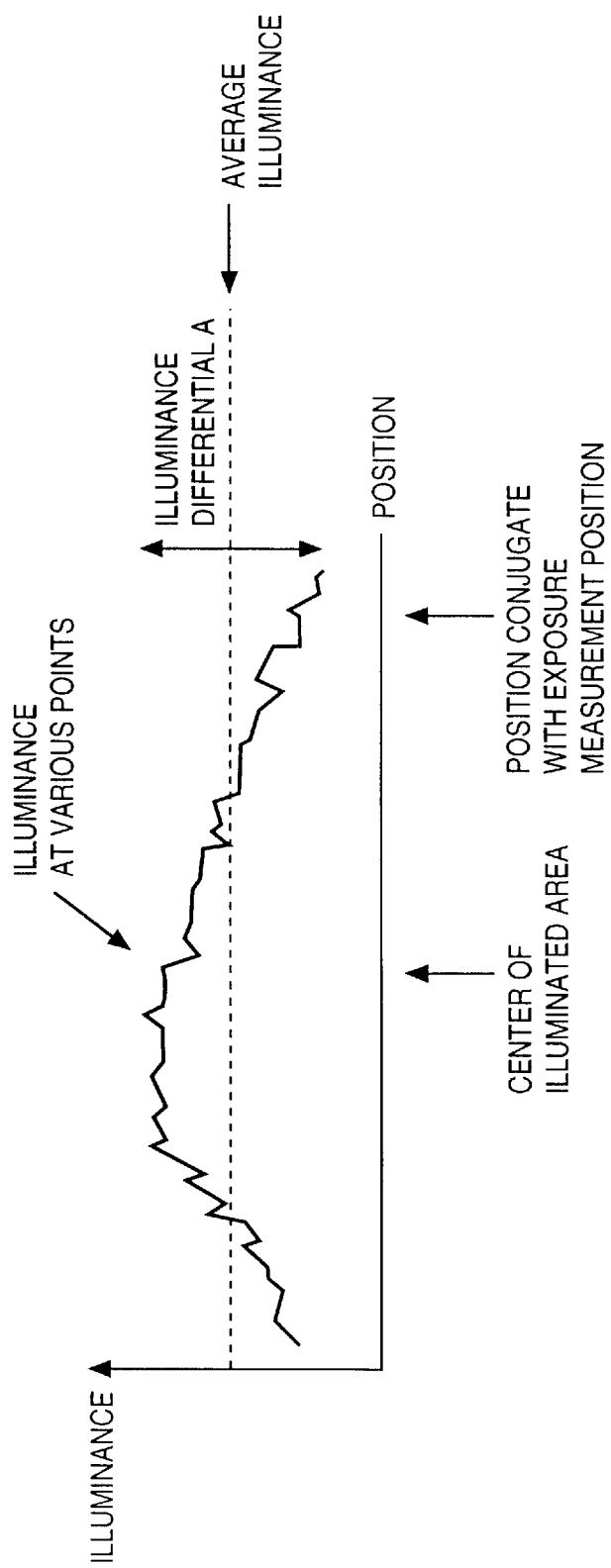

EXPOSURE CONTROL METHOD, EXPOSURE APPARATUS AND DEVICE MANUFACTURING METHOD

FIELD OF THE INVENTION

This invention relates to an exposure control method for controlling the amount of exposure of a photosensitive substrate in an exposure apparatus used in a lithographic process for manufacturing, e.g., a semiconductor element, a liquid crystal element, an image sensing device (CCD, etc.) and a thin magnetic head. The method is applicable not only to a batch exposure type exposure apparatus but also in a case where the amount of exposure is controlled using a step-and-scan scanning exposure type projection exposure apparatus in which part of the pattern on a mask is projected onto a photosensitive substrate and the mask and substrate are then scanned synchronously with respect to a projection optics unit, whereby the mask pattern is transferred to shot areas on the substrate to expose these areas to the mask pattern. The invention further relates to an exposure control apparatus and device manufacturing method to which this exposure control method is applied.

BACKGROUND OF THE INVENTION

FIG. 2 illustrates a projection exposure apparatus according to the prior art. The apparatus includes a light source 1 such as a high-voltage mercury-vapor lamp which emits illuminating light. The light from the light source 1 is condensed to a point by a condensing mirror 2 and impinges upon a fly-eye lens 4 through an optics unit 3. There are instances where a laser or the like may be used as the source of illuminating light, in which case the condensing mirror 2 is unnecessary and the light from the laser need only impinge upon the fly-eye lens 4 through the optics unit 3.

The fly-eye lens 4 is a bundle of rod lenses the entrance and exit surfaces of which have their focal points on each other's surface. A group of light beams that impinge upon the rod lenses at an identical angle are condensed at the exit surfaces and form a number of points of condensed light on the exit surface of the fly-eye lens.

Utilizing the group of condensed points of light formed on the exit surface of the fly-eye lens, the optics unit 5 uniformly illuminates the position of a diaphragm 6, which controls an illuminated area at a position that is conjugate with the plane of a mask 8. An optics unit 7 is for forming the image of the position of the uniformly illuminated diaphragm 6 on the mask surface 8. Uniform illumination of the mask surface 8 is achieved by forming the image of the position of the uniformly illuminated diaphragm 6 on the mask surface 8. It should be noted that the position of mask 8, the position of diaphragm 6 and the entrance surface of the fly-eye lens 4 are located at conjugate points.

The apparatus further includes a projection optics unit 9 for forming the image of the pattern of mask 8 on a substrate 11. A photosensitive agent that has been applied to the substrate 11 is exposed to the mask pattern by the illuminating light from the illuminating optics unit. The projection optics unit 9 is a telecentric unit in which projection magnification does not change even if the position of the mask 8 or the position of the substrate 11 shifts along the optical axis. The arrangement is such that a principal ray which passes through the center of the projection unit at the position of a diaphragm 10 perpendicularly intersects the mark surface and the substrate.

It should be noted that the diaphragm 10 of the projection optics unit 9 and the exit surface of the fly-eye lens 4 are located at conjugate points.

The apparatus further includes a movable stage 12 on which the substrate 11 and an exposure sensor 15 are mounted. The exposure sensor 15 can be moved over the illuminated area when the amount of exposure at a position identical with that of the substrate 11 is measured with stepping movement for exposing a plurality of shots on the substrate 11.

In such a projection exposure apparatus used in the manufacture of semiconductor devices and the like, it is required that the substrate be subjected to a proper amount of exposure, which depends upon the photosensitive agent that has been applied to the substrate, in order that the mask pattern will be transferred to the substrate in an optimum fashion. If the amount of exposure is less than the proper amount in a case where a positive pattern and a negative resist are used, for example, the photosensitive agent will not be sensitized sufficiently and the lines of the pattern may become too fine and be rendered discontinuous at points.

If the amount of exposure is too large, on the other hand, the photosensitive agent will be sensitized excessively and the lines of the pattern may become so thick that neighboring lines will contact each other.

Further, if the amount of exposure is less than the proper amount in a case where a negative pattern and a positive resist are used, the photosensitive agent will not be sensitized sufficiently and the lines of the pattern may become so thick that neighboring lines will contact each other.

If the amount of exposure is too large, on the other hand, the photosensitive agent will be sensitized excessively and the lines of the pattern may become too fine and be rendered discontinuous at points. In any case, when exposure is carried out with an improper amount of exposure, a suitable pattern cannot be formed on the substrate. This invites a decline in yield when semiconductor devices or the like are manufactured.

Control of the amount of exposure to which a substrate is subjected must be controlled in order to obtain the proper amount of exposure. However, the amount of exposure being applied to a substrate cannot be measured directly during the transfer of the mask pattern to the substrate. If the amount of exposure is measured along the optical path of the exposing light, the shadow of the exposure sensor has an influence when the mask pattern is transferred to the substrate. For this reason, the amount of exposure is controlled upon measuring the amount of exposure at a position which is at a conjugate point with the substrate and offset from the optical path of the exposing light.

More specifically, use is made of a half-mirror 13, which has a very low reflectivity, inserted into the optical path of the exposing light in order to produce a position which is at a conjugate point with respect to the substrate 11 and offset from the optical path of the exposing light. That is, the half-mirror 13 produces a position which is at a point conjugate with the substrate 11 and offset from the optical path of the exposing light at the position of an exposure sensor 14. The sensor 14 is placed directly in front of the point conjugate with the substrate 11 and at an inclination relative to the optical axis of the exposing light for the purpose of measuring the amount of exposure from the light diverted to it by the mirror 13.

The exposure sensor 14 is so adapted as to be capable of measuring an amount of exposure that corresponds to the amount of exposure exactly at the center of the illuminated area, namely at the position of the substrate 11 on the optical axis. Before the substrate is exposed, the exposure sensor 15 mounted on the stage is moved to the center of the illuminated zone, trial exposure is carried out and the relationship between the amount of exposure at the position measured by the exposure sensor 14 and the amount of exposure on the substrate is found, thereby making it possible to estimate the amount of exposure on the substrate from the output of the exposure sensor 14.

A controller 16 is provided for controlling the amount of exposure. On the basis of the output of the exposure sensor 14, and in accordance with a predetermined control program, the controller 16 controls the amount of exposure by controlling the opening and closing of a shutter 17, the transmittance of beam attenuating means 18, the transmittance of which is variable, and the input to the light source 1.

In accordance with the above-described prior art, however, in order to measure the amount of exposure at a position that is conjugate with the substrate 11 along the optical axis, it is required that the half-mirror 13 be inserted deeply in such a manner that the position conjugate with the substrate 11 along the optical axis will be offset from the optical path, as illustrated in FIG. 2. Further, in order to assure that the optical path of the reflected light from the half-mirror 13 to the exposure sensor 14 will not be obstructed by the lens 5 immediately in front of the half-mirror 13, the half-mirror 13 and the lens 5 directly in front of it must be spaced apart.

By way of example, FIG. 5 illustrates the optical path from the lens 5 directly in from the half-mirror 13 to the diaphragm 6 controlling the illuminated area in a case where the inclination of the half-mirror 13 is such that the half-mirror is almost perpendicular to the optical axis. In this case, length A which the half-mirror 13 occupies along the optical axis can be reduced, as is obvious from FIG. 5. However, in order to assure that a reflected light beam will not be obstructed by the lens 5 immediately in front of the half-mirror 13, it is required that the relation C<Btanθ hold, where C represents the radius of the lens 5 and θ represents the angle defined by the reflected light beam and the optical axis. As a consequence, the angel θ becomes small and spacing B between the half-mirror 13 and the lens 5 directly in front of the half-mirror 13 becomes too large.

By contrast, FIG. 6 illustrates the optical path from the lens directly in from the half-mirror 13 to the diaphragm 6 controlling the illuminated area in a case where the inclination of the half mirror 13 is such that the half-mirror is nearly parallel to the optical axis. In this case, the angle θ between the reflected light beam and the optical axis can be enlarged, thereby making it possible to shorten the distance between the half-mirror 13 and the lens 5 directly in front of it, as is evident from FIG. 6. However, the length A which the half-mirror 13 occupies along the optical axis becomes too large.

The end result is that with the prior art described above, a length A+B along the optical axis necessary to measure the amount of exposure by diverting light using the half-mirror 13 cannot be made shorter than a specific length, with the consequence that the space occupied by the exposure measuring means cannot be reduced. However, as a result of the improved performance and capabilities sought for projection exposure apparatus, the optics unit employed in such apparatus has become extremely complicated and there is a tendency for such apparatus to be of ever increasing size. Accordingly, in order to reduce the size of a projection exposure apparatus even marginally, there is strong demand to reduce the space occupied by the exposure measurement means as much as possible.

SUMMARY OF THE INVENTION

The present invention has been proposed to solve the problems of the prior art and its object is to provide an exposure control method which uses exposure measuring means that occupies little space, as well as a projection exposure apparatus and device manufacturing method which employ this method.

According to the present invention, the foregoing object is attained by providing a method of controlling an amount of exposure in which when a pattern on a reticle is illuminated by illuminating light from a light source so as to be projected onto a substrate to expose the same, an amount of exposure at a position substantially conjugate with an illuminated area on the substrate is measured and the amount of exposure applied to the substrate is controlled based upon a result of the measurement, wherein the position at which the amount of exposure is measured is a position substantially conjugate with an off-optical axis position in the illuminated area on the substrate.

In accordance with the prior art, the amount of exposure of the substrate is controlled upon measuring the amount of exposure at a position, which is along the optical axis, substantially conjugate with the substrate. By contrast, in accordance with the present invention, the amount of exposure of the substrate is controlled upon measuring the amount of exposure at a position, which is offset from the optical axis, substantially conjugate with the substrate. As a result, the half-mirror for measuring the amount of exposure is reduced in size or eliminated, thereby achieving a reduction in the space occupied by the means for measuring the amount of exposure.

The present invention further provides an exposure apparatus having projection exposure means for illuminating a pattern on a reticle by illuminating light from a light source so as to project the pattern onto a substrate to expose the same, exposure measurement means for measuring an amount of exposure at a position substantially conjugate with an illuminated area on the substrate, and the exposure control means for controlling the amount of exposure of the substrate based upon the result of the measurement, wherein the exposure measurement means measures the amount of exposure at a position, which is offset from the optical axis, substantially conjugate with the substrate and the exposure control means controls the amount of exposure of the substrate.

The present invention further provides a device manufacturing method for manufacturing a device by illuminating a pattern on a reticle by illuminating light so as to project the pattern upon a substrate to expose the same, wherein when exposure by projection of the illuminating light is performed, an amount of exposure at a position substantially conjugate with an illuminated area on the substrate is measured and an amount of exposure of the substrate is controlled based upon the result of the measurement, wherein the amount of exposure of the substrate is controlled upon measuring the amount of exposure at a position, which is offset from the optical axis, substantially conjugate with the substrate.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 9 is a graph schematically representing illuminance at various points on a line passing through the center of an illuminated area;

DESCRIPTION OF THE PREFERRED EMBODIMENTS

Preferred embodiments of the present invention will now be described in detail in accordance with the accompanying drawings.

In the preferred embodiments according to the present invention, a position conjugate with a position that is offset from the optical axis exists on an optical path to which the illuminating light is diverted by reflection at a half-mirror or lens, which is convex on the side of the light source, disposed in the optical path of the illuminating light. Alternatively, a position conjugate with a position that is offset from the optical axis exists on a diaphragm, which controls the illuminated area on the substrate, at a position substantially conjugate with the illuminated area.

Further, before the substrate is subjected to exposure by projection, a relationship is found between the amount of exposure at the position conjugate with the off-optical-axis position and the amount of exposure on the substrate on the optical axis, off the optical axis or at a predetermined position. Then, when the substrate is subjected to exposure by projection, the amount of exposure is controlled using this relationship or upon taking into account this relationship as well as any unevenness in illuminance in the illuminated area on the substrate.

The projection exposure means may be scanning-type projection exposure means which, while part of the reticle pattern is being projected onto the substrate, scans the reticle and substrate synchronously to thereby scanningly project the reticle pattern onto the substrate.

<Embodiments>

Figure 1:
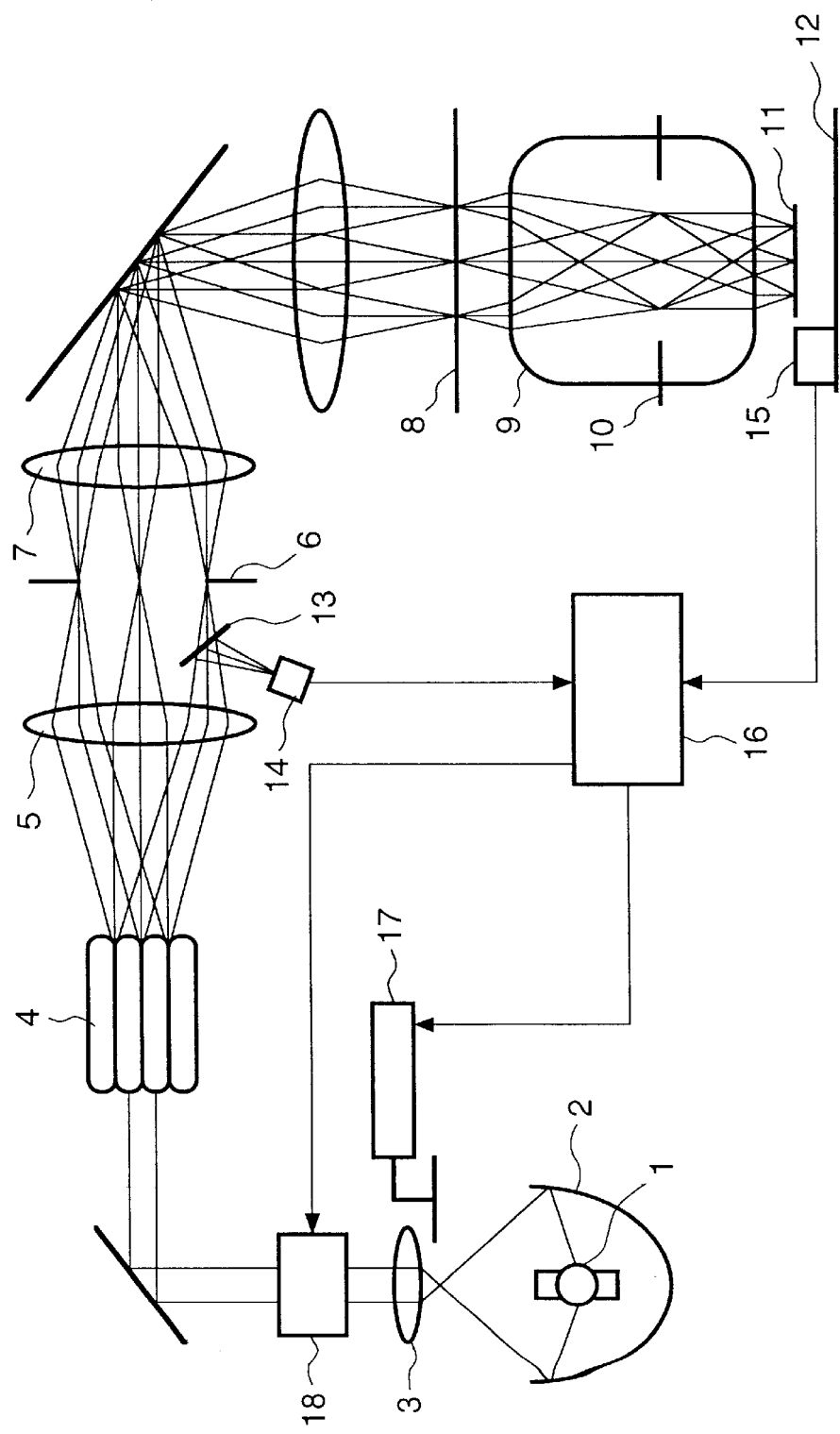
FIG. 1 is a diagram illustrating an exposure apparatus according to a first embodiment of the present invention.
Figure 2:
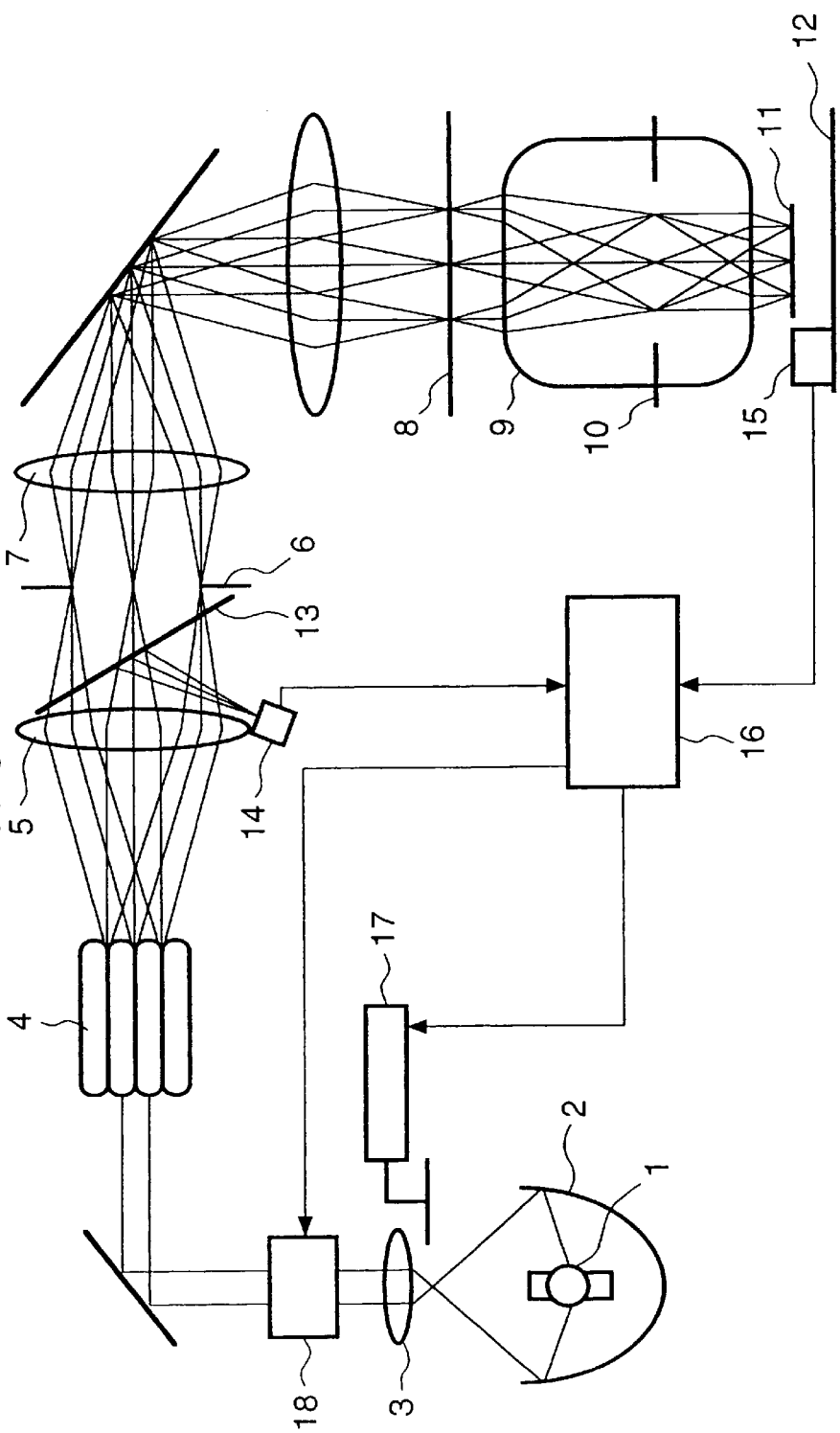
FIG. 2 is a diagram illustrating a projection exposure apparatus according to an example of the prior art.

FIG. 1 illustrates a projection exposure apparatus according to a first embodiment of the present invention. As shown in FIG. 1, the projection exposure apparatus according to this embodiment measures the amount of exposure at a position substantially conjugate with the illuminated area on the substrate 11 when the pattern on the mask 8 is illuminated by illuminating light from the light source 1 so as to be projected onto the substrate 11 to expose the same. The amount of exposure of the substrate 11 is controlled based upon the result of this measurement. The position at which the amount of exposure is measured is a position substantially conjugate with a position, which is offset from the optical axis, in the illuminated area on substrate 11. This position is on an optical path to which the illuminating light is diverted by the half-mirror 13 disposed on the optical path of the illuminating light. More specifically, the position and size of the half-mirror 13 and the position of the exposure sensor 14 differ from those of the prior art shown in FIG. 2. In this embodiment, the half-mirror 13 is placed in such a manner that an off-optical-axis position at a position substantially conjugate with the substrate 11 can be obtained at the position of the exposure sensor 14. Other elements of this embodiment are similar to those of the prior art shown in FIG. 2.

On the basis of the output of the exposure sensor 14, which is placed off the optical axis at the position substantially conjugate with the substrate 11, and in accordance with a predetermined control program, the exposure controller 16 controls the amount of exposure by controlling the opening and closing of a shutter 17, the transmittance of a beam attenuating means 18, the transmittance of which is variable, and the input to the light source 1. More specifically, in the prior art shown in FIG. 2, the amount of exposure of the substrate is controlled upon measuring the amount of exposure at a position, which is along the optical axis, substantially conjugate with the substrate. By contrast, in accordance with this embodiment, the amount of exposure of the substrate is controlled upon measuring the amount of exposure at a position, which is offset from the optical axis, substantially conjugate with the substrate.

In accordance with this embodiment, the space necessary to measure the amount of exposure can be reduced. The reason for this will be described with reference to FIGS. 10A and 10B. These drawings illustrate light rays from the lens 5 directly in front of the half-mirror 13 to the diaphragm 6 which controls the illuminated area in accordance with this embodiment. The light rays necessary to control the amount of exposure in this embodiment are the light rays offset from the optical axis at the position of the diaphragm 6. This means that it will suffice if the half-mirror 13 is inserted only slightly into the optical path of the exposing light in the manner illustrated in FIG. 10A. As a result, the length A along the optical axis occupied by the half-mirror 13 can be reduced.

Further, in order to assure that the optical path of the light flux that reaches the exposure sensor 14 upon being reflected by the half-mirror 13 will not be obstructed, the necessary distance B between the lens 5 directly in front of the half-mirror 13 and the half-mirror 13 along the optical axis also can be reduced because the radius C of the lens 5 becomes smaller in comparison with that of the prior art, which controls the amount of exposure by diverting the light along the optical axis, in the relation C<Btanθ that is required to avoid obstruction by the lens 5. As a result, the length A+B along the optical axis necessary to measure the amount of exposure by diverting light using the half-mirror 13 can be made shorter in comparison with the prior art.

Figure 10A:
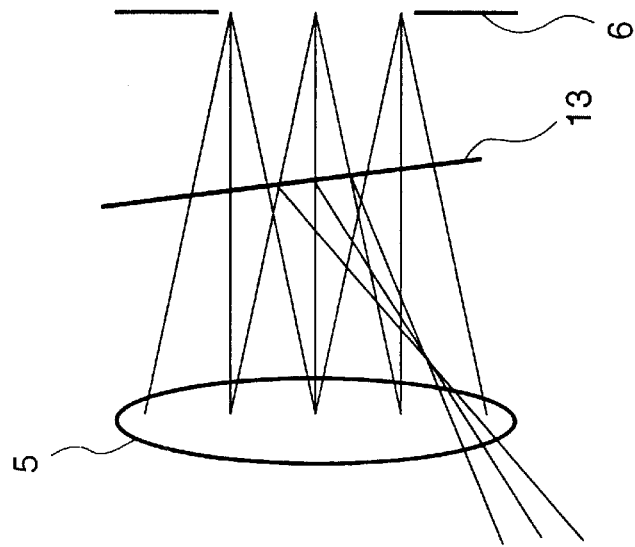
FIGS. 10A and 10B are diagrams illustrating the effects of the first embodiment.
Figure 10B:
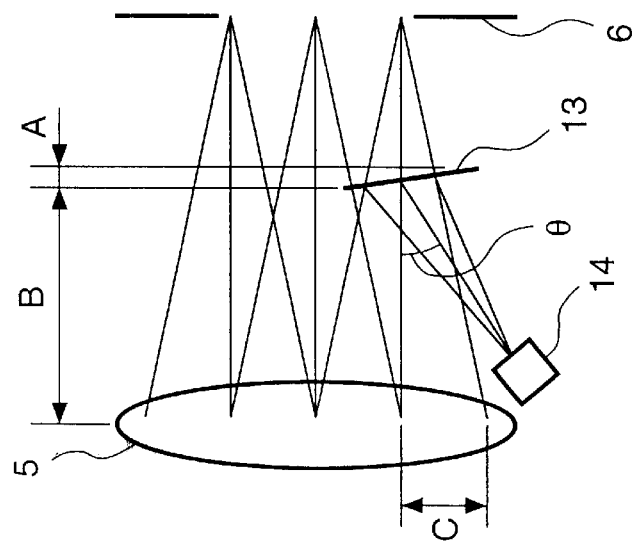

It should be noted that if it is attempted to extract light rays along the optical axis in a manner similar to that of the prior art under conditions identical with those of the embodiment shown in FIG. 10A, the light rays along the optical axis will upon reflection strike the lens 5 located directly in front of the half-mirror 13, as a consequence of which the exposure sensor must be placed in the optical path of the exposing light, as is evident from FIG. 10B. If the exposure sensor is placed in the optical path of the exposing light, the shadow of the sensor will appear on the wafer and give rise to illuminance unevenness. As a result, it is impossible to control the amount of exposure with the prior-art arrangement using light rays along the optical axis under conditions identical with those shown in FIG. 10A.

When a relationship is established between the amount of exposure at the position of exposure measurement and the amount of exposure on the substrate 11 in the prior art, the exposure sensor 15 mounted on the stage is placed on the optical axis and trial exposure is carried out to thereby establish the relationship between the amount of exposure measured at the center of the illuminated area, i.e., on the optical axis, as the amount of exposure of the substrate 11, and the amount of exposure at the position where the amount of exposure is measured. By contrast, the present embodiment is characterized in that when trial exposure is performed, a relationship is established between any one of (a) the amount of exposure measured at the center of the illuminated area with the exposure sensor 15 disposed on the optical axis, (b) the amount of exposure measured in an illuminated area substantially conjugate with the exposure measurement position with the exposure sensor 15 disposed in this illuminated area substantially conjugate with the exposure measurement position and (c) the amount of exposure measured at a predetermined position in the illuminated area with the exposure sensor 15 disposed at a predetermined position in the illuminated area, and the amount of exposure measured at the exposure measurement position.

In the case when the amount of exposure at the exposure measurement position and the amount of exposure measured at the center of the illuminated area are correlated in this manner, the amount of exposure of the substrate 11 is represented by the amount of exposure at the center of the illuminated area. Since the projection exposure apparatus is so adapted that a substantially uniform illuminance distribution is obtained in the illuminated area, the amount of exposure can be controlled with sufficient precision over the entire illuminated area even if the amount of exposure of the substrate 11 is represented by the amount of exposure at the center of the illuminated area.

Further, in the case when the amount of exposure at the exposure measurement position and the amount of exposure measured in the illuminated area at the center of an illuminated area substantially conjugate with the exposure measurement position are correlated, the amount of exposure of the substrate 11 is represented by the amount of exposure in the illuminated area substantially conjugate with the exposure measurement position. Since the projection exposure apparatus is so adapted that a substantially uniform illuminance distribution is obtained in the illuminated area, the amount of exposure can be controlled with sufficient precision over the entire illuminated area even if the amount of exposure of the substrate 11 is represented by the amount of exposure in the illuminated area substantially conjugate with the exposure measurement position.

Further, in the case when the amount of exposure at the exposure measurement position and the amount of exposure measured at a predetermined position in the illuminated area are correlated, the amount of exposure of the substrate 11 is represented by the amount of exposure at the predetermined position in the illuminated area. Since the projection exposure apparatus is so adapted that a substantially uniform illuminance distribution is obtained in the illuminated area, the amount of exposure can be controlled with sufficient precision over the entire illuminated area even if the amount of exposure of the substrate 11 is represented by the amount of exposure at the predetermined position in the illuminated area.

Because a substantially uniform illuminance distribution is obtained in the illuminated area in the projection exposure apparatus, the amount of exposure can be controlled with sufficient precision over the entire illuminated area if the amount of exposure is controlled, based upon the relationship between the amounts of exposure correlated as set fort above, in such a manner that the amount of exposure at the exposure measurement position will become a quantity that corresponds to the optimum amount of exposure at the correlated point on the substrate 11. In actuality, however, there is some slight unevenness in illuminance in the illuminated area. The amount of exposure can be controlled much more precisely, therefore, by controlling it upon taking into account not only the relationship between the amount of exposure at the exposure measurement position and the amount of exposure at a predetermined position on the substrate, which have been correlated by one of the methods described above, but also the illuminance unevenness in the illuminated area.

By way of example, FIG. 9 schematically illustrates illuminance at various points on a line passing through the center of an illuminated area. It will be understood that when the amount of exposure at the center of the illuminated area and the amount of exposure at the exposure measurement position are correlated and exposure is carried out in such a manner that the center of the illuminated area receives the proper amount of exposure, the center of the illuminated area does receive the proper amount of exposure but the edges of the illuminated area are not exposed adequately.

Accordingly, by taking such irregular illuminance into consideration and performing control of the amount of exposure in such a manner that the average amount of exposure over the entire illuminated area indicated by the dashed line becomes the proper amount of exposure, the substrate 11 can be exposed at an amount of exposure near the proper amount over the entirety of the illuminated area.

Another example of controlling the amount of exposure upon taking illuminance unevenness into consideration is as follows: In a case when the pattern on the mask 8 requires a high resolution in a certain area but does not require it in another area, it is necessary that the area requiring the high resolution have its amount of exposure controlled with higher precision. Accordingly, on the basis of the amount of exposure at a representative point on the substrate 11 that has been correlated with the amount of exposure at the exposure measurement position and the ratio between a representative point, which is predicted from the illuminance unevenness, and the illuminance of the area requiring the high resolution, the amount of exposure is controlled in such a manner that the amount of exposure in the area requiring the high resolution becomes the proper amount of exposure. This makes it possible to improve the yield of the operation.

There are various methods of measuring illuminance unevenness in the illuminated area. For example, the exposure sensor 15 on the stage can be moved to two or more locations in the illuminated area, dummy exposure can be performed at each of these locations in such a manner that an amount of exposure identical with that at the exposure measurement position is obtained, and illuminance unevenness can be measured by comparing the outputs of the exposure sensor 15.

Figure 8:
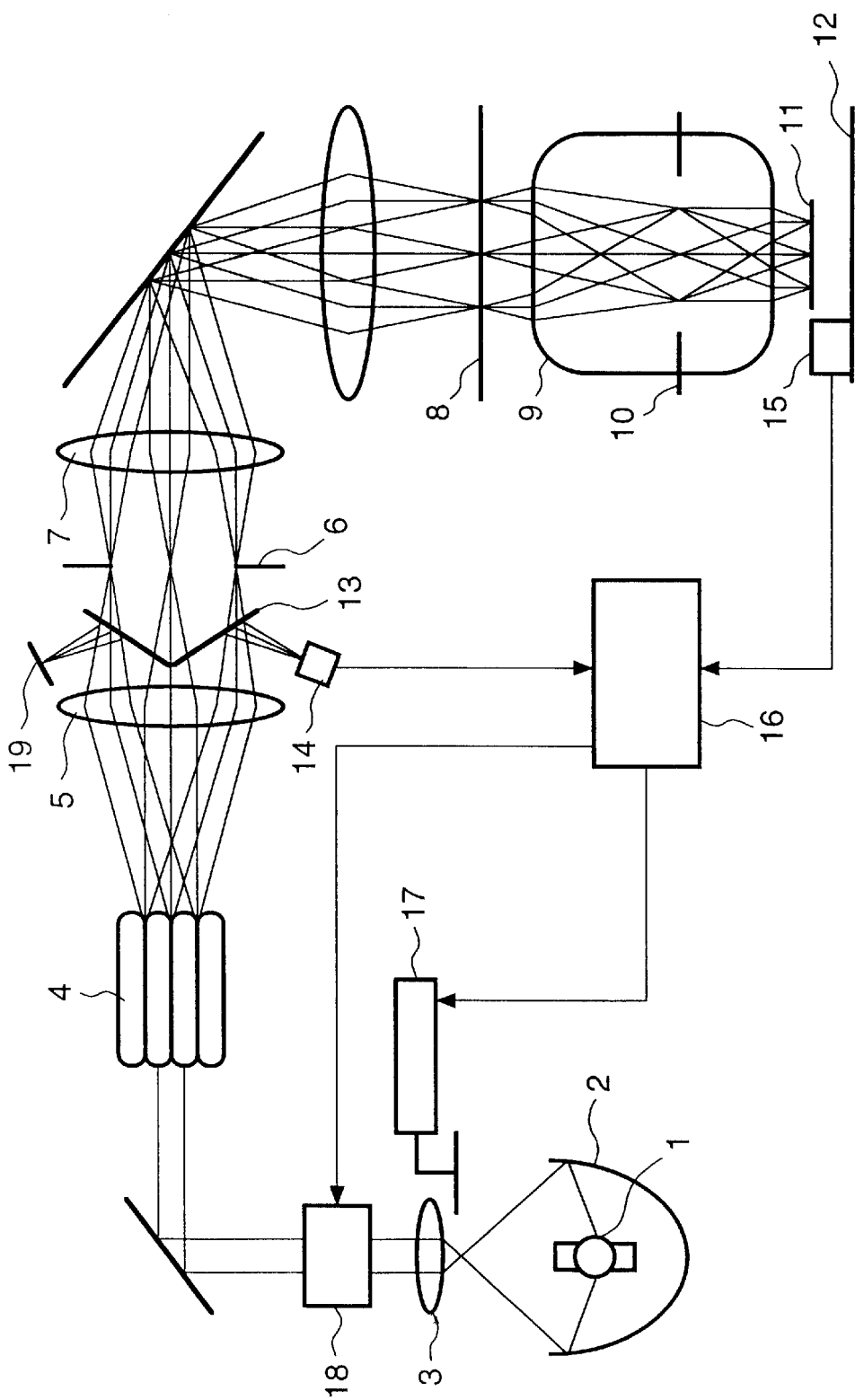
FIG. 8 is a diagram showing an example of an arrangement for eliminating a difference in illuminance produced between an area in which a half-mirror is present and an area in which the half-mirror is absent.
Figure 11:
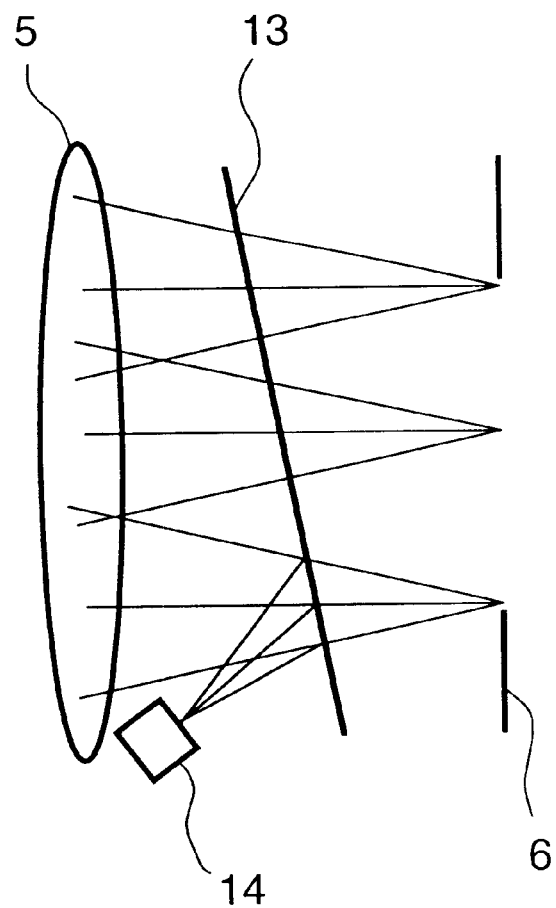
FIG. 11 illustrates another example of an arrangement for eliminating a difference in illuminance produced between an area in which a half-mirror is present and an area in which the half-mirror is absent.

When the half-mirror 13 is inserted part of the way, there are instances where a difference in illuminance develops between the area in which the half-mirror 13 is present and the area in which it is not. In such cases, the difference in illuminance can be eliminated by inserting an object having a transmittance approximately equal to that of the half-mirror 13 in the area devoid of the half-mirror 13. The object having the approximately equal transmittance may be a material coated with a film so as to have the approximately equal transmittance. Further, as shown in FIG. 8, the exposing light may be reflected in a direction different from that of the exposure sensor 14 by an identical half-mirror inserted from a different direction, and the reflected light rays may be absorbed by an absorbing plate 19. Or, in a manner similar to that of the prior art, the half-mirror 13 may be inserted deeply so as to be struck by all of the exposing light, as shown in FIG. 11, thereby partially reflecting the light uniformly over the entire illuminated area. Only the light rays offset from the optical axis would be observed. It should be noted, however, that when the half-mirror 13 is inserted deeply, the light rays along the optical axis or the light rays not observed will strike components such as the lens and may cause flare. This necessitates measures such as treating the lens barrel that holds the lenses in such a manner that light will not be reflected.

Besides this method of adjusting transmittance at the periphery of the half-mirror 13, another method of arranging it so that a difference in illuminance will not occur between the areas in which the half-mirror 13 is and is not present is to partially block the light that impinges upon at least one of the rod lenses constituting the fly-eye lens 4 which forms the secondary light source. Alternatively, the transmittance of this rod lens may be reduced. According to such an arrangement, the position of the half-mirror 13 substantially coincides with the surface illuminated by Koehler illumination in which the points of condensed light on the exit surface of the fly-eye lens 4 serve as the secondary light source. As a result, the output-angle distribution from the points of condensed light formed on the exit surface of the fly-eye lens 4 is controlled by partially blocking the light at the entrance surface of the fly-eye lens 4 or by reducing the transmittance of the lens. The result is that the illuminance distribution of the illuminated surface can be controlled.

There are various methods available for the purpose of partially blocking or reducing the transmittance of light that impinges upon the rod lenses constituting the fly-eye lens 4. For example, an opaque object such as chrome may be disposed directly in front of the entrance surface of the fly-eye lens 4 so as to partially block the light, or parallel plates in which the film characteristic is partially changed to partially reduce transmittance may be disposed directly in front of the entrance surface of the fly-eye lens 4. Another method is to partially increase slightly the surface roughness of the entrance surface of at least one of the rod lenses of fly-eye lens 4 so as to obtain a frosted-glass-like stage, thereby reducing transmittance.

Figure 3:
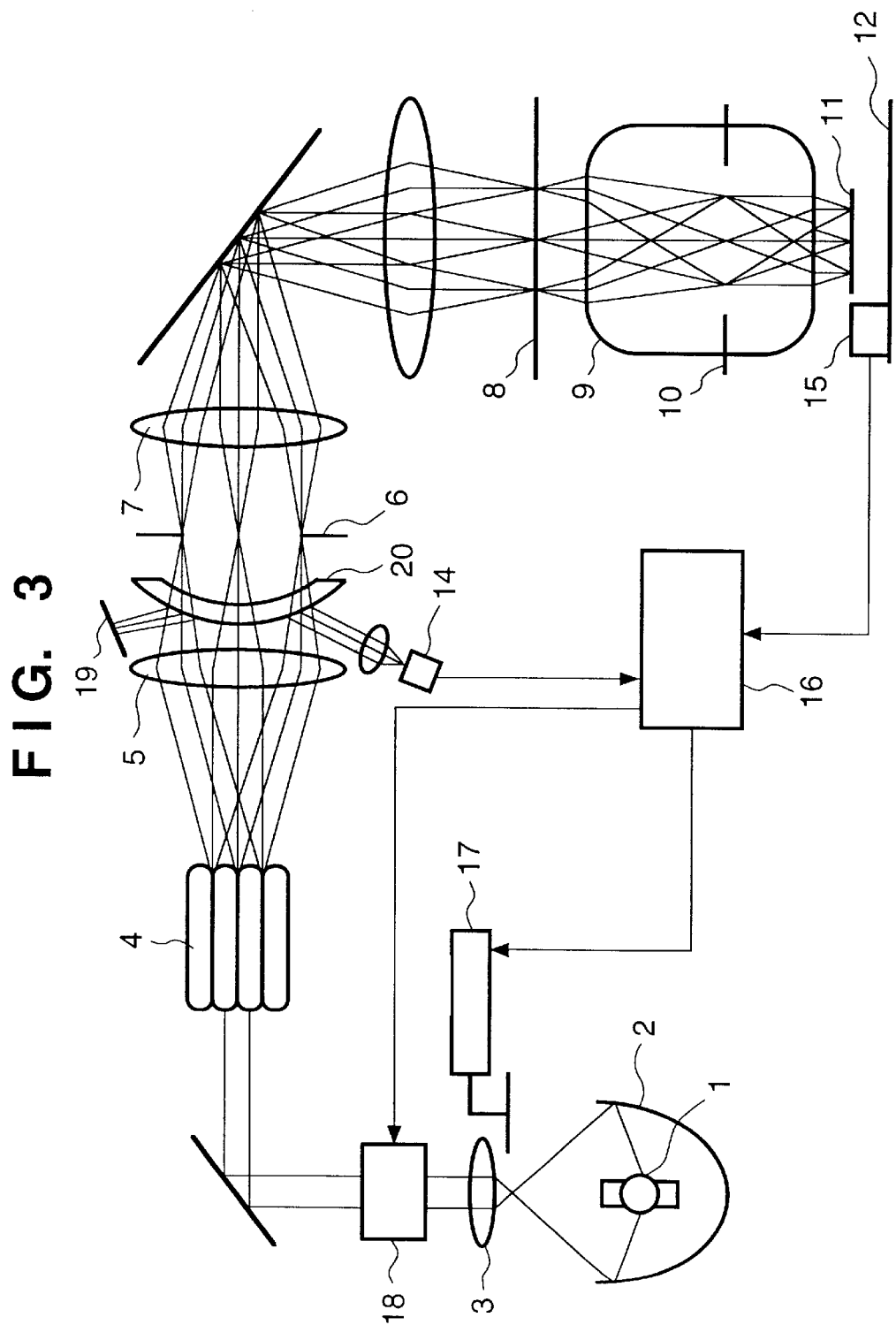
FIG. 3 is a diagram illustrating a projection exposure apparatus according to a second embodiment of the present invention.

FIG. 3 is a diagram illustrating a projection exposure apparatus according to a second embodiment of the present invention. Whereas the optical path is caused to diverge by the half-mirror 13 in the first embodiment, this embodiment is characterized in that the amount of exposure is controlled by reflected light from a lens 20 that is convex on the side of the light source.

The amount of exposure at a position conjugate with the substrate 11 necessary to carry out control of the amount of exposure is not that great. Accordingly, in order to control the amount of exposure using reflected light from the convex surface of lens 20, one surface of the lens 20 need only be provided with a film that prevents reflection. This will make it possible to obtain enough light to control the amount of exposure. Since the optics unit of the projection exposure apparatus is a coaxial unit, the light that travels along the optical axis returns to the light source even if it is reflected by the lens 20. Therefore, though position on the optical axis conjugate with substrate 11 cannot be produced by reflection of light from the lens, a position off the optical axis conjugate with the substrate 11 can be produced because the lens 20 possesses curvature. Accordingly, if the amount of exposure is controlled based upon the amount of exposure off the optical axis, such control can be achieved using light reflected from the lens 20. As a result, the space needed to measure the amount of exposure can be reduced.

In this embodiment, control of the amount of exposure can be carried out by components and methodology similar to those of the first embodiment in regard to elements other than those, such as the lens 20, used to measure the amount of exposure.

Figure 4:
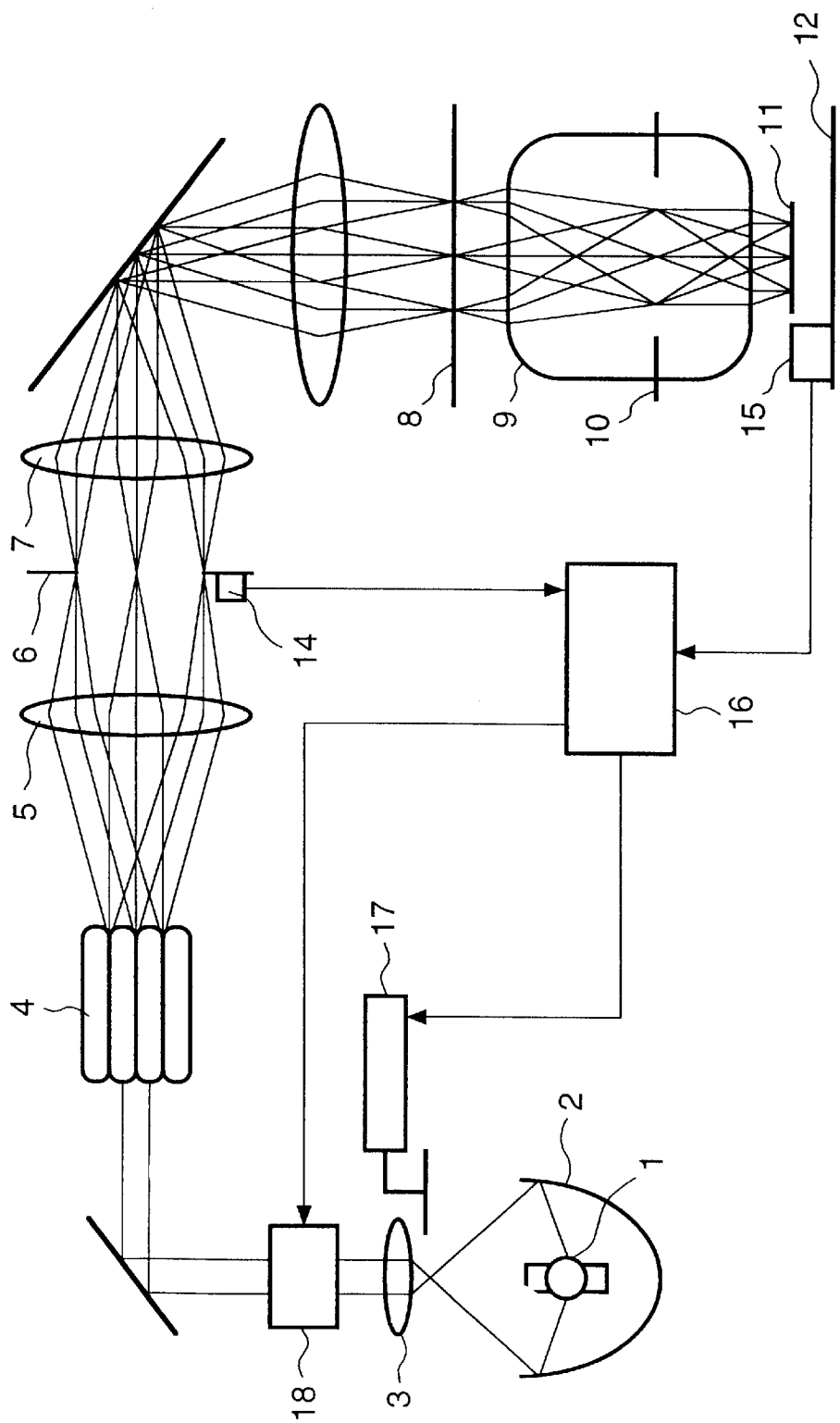
FIG. 4 is a diagram illustrating a projection exposure apparatus according to a third embodiment of the present invention.
Figure 5:
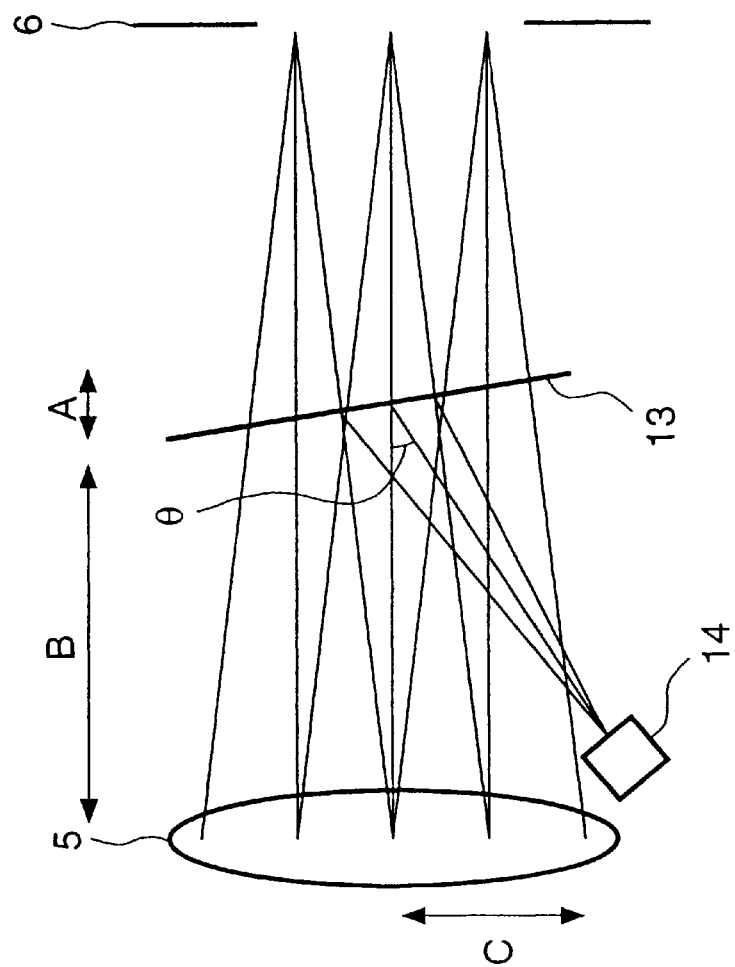
FIG. 5 is a diagram showing an optical axis in the vicinity of a half-mirror in a case where the inclination of the half-mirror is such that the half-mirror is nearly perpendicular to the optical axis in the prior art illustrated in FIG. 2.
Figure 6:
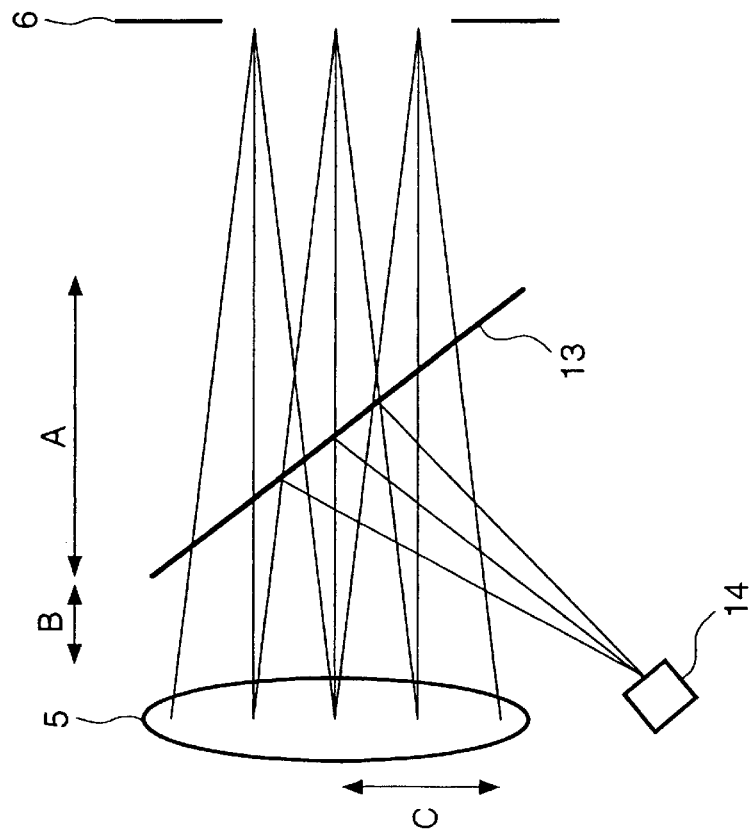
FIG. 6 is a diagram showing an optical axis in the vicinity of a half-mirror in a case where the inclination of the half-mirror is such that the half-mirror is nearly parallel to the optical axis in the prior art illustrated in FIG. 2.

FIG. 4 is a diagram illustrating a projection exposure apparatus according to a third embodiment of the present invention. This embodiment is characterized in that instead of causing the optical path to divert by a half-mirror to produce a point conjugate with the substrate off the optical axis of the exposing light, the exposure sensor 14 is placed on the diaphragm 6 that controls the illuminated area.

In the present invention, the amount of exposure off the optical axis is measured to control the amount of exposure of the substrate. To this end, according to the third embodiment, measurement of the amount of exposure for the purpose of controlling the amount of exposure can be carried out by measuring the amount of exposure of the area shielded by the diaphragm 6 that controls the illuminated area. As a result, it is unnecessary to divert the optical path and, hence, it is unnecessary to provide the illumination device with a half-mirror. This makes it possible to reduce the space in the illumination device needed to measure the amount of exposure.

In this embodiment, control of the amount of exposure can be carried out by components and methodology similar to those of the first embodiment in regard to elements other than those, such as the position of the lens exposure sensor 14, used to measure the amount of exposure.

In a case where the projection exposure apparatus is of the scanning type, the position at which the amount of exposure is measured is the same. The only difference is the program for controlling the amount of exposure. In the scanning-type projection exposure apparatus, the program is for step-and-repeat projection exposure. Accordingly, if the exposure control program for a scanning-type projection exposure apparatus is used, the present invention can be applied to control the amount of exposure in a scanning-type projection exposure apparatus.

The reason why the exposure control program for a scanning-type projection exposure apparatus differs from that for a step-and-repeat projection exposure apparatus is as follows: In a step-and-repeat projection exposure apparatus, the amount of exposure is controlled by controlling the opening and closing of the shutter 17, the transmittance of the beam attenuating means 18, the transmittance of which is variable, and the input to the light source 1. In the scanning-type projection exposure apparatus, on the other hand, the mask and substrate are scanned synchronously to thereby move the illuminated area, which is part of the exposure area, and expose the entirety of the exposure area. This means that exposure cannot be completed until the scanning of the mask and the substrate has been completed in regard to the entire exposure area. Consequently, control of the amount of exposure by opening and closing the shutter 17 cannot be achieved.

The amount of exposure in a scanning-type projection exposure apparatus is decided by s×I/v, where s represents the length of the illuminated area in the scanning direction, I the illuminance and v the scanning speed. Accordingly, in order to control the amount of exposure in a scanning-type projection exposure apparatus, it is necessary to control at least the length s of the illuminated area in the scanning direction, the illuminance I or the scanning speed v.

Figure 7:
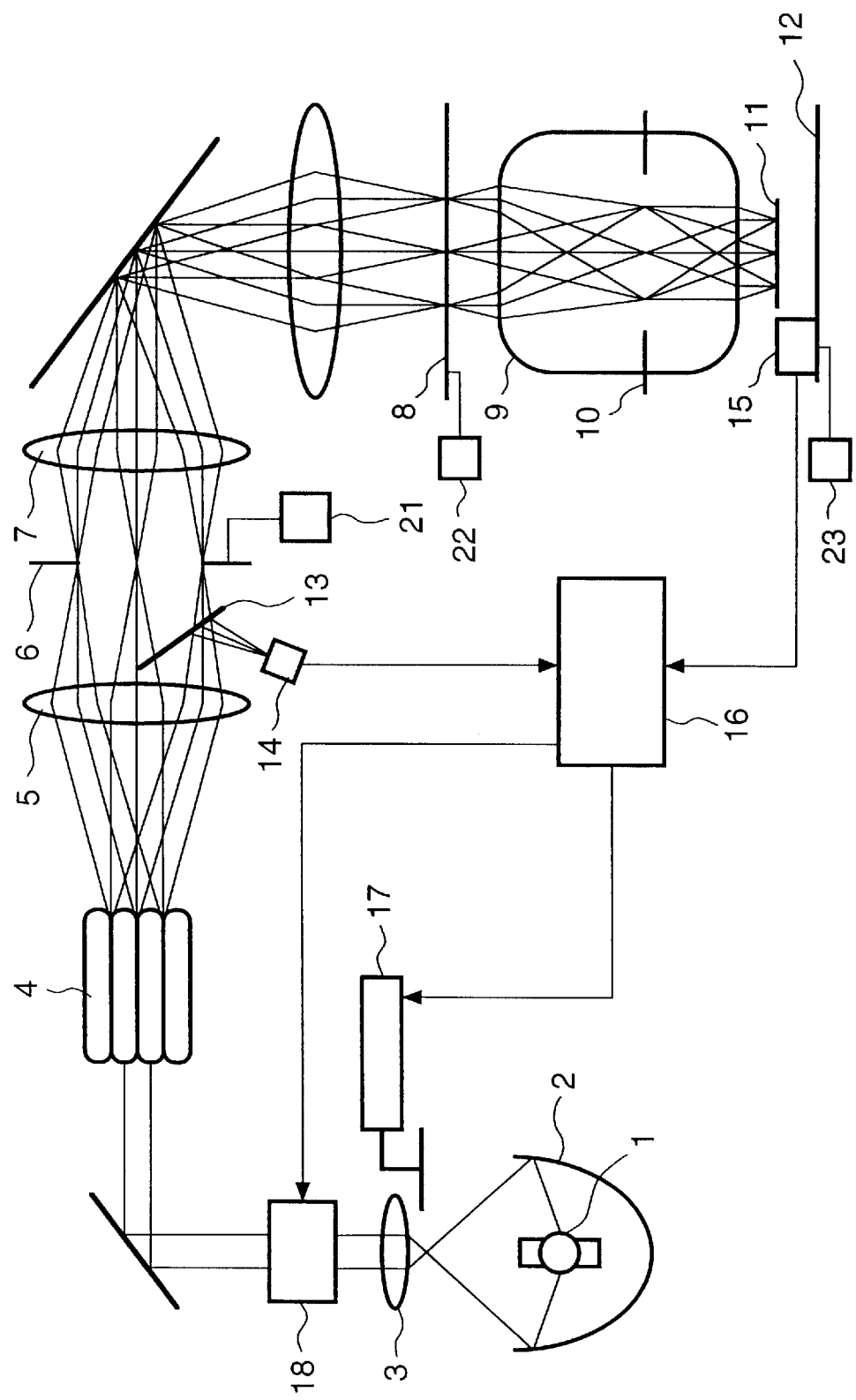
FIG. 7 is a diagram illustrating a scanning-type projection exposure apparatus according to a fourth embodiment of the present invention.

FIG. 7 illustrates a scanning-type projection exposure apparatus according to a fourth embodiment of the present invention. This apparatus is similar to that of the first embodiment except for the fact that it is of the scanning type. More specifically, this apparatus differs from the step-and-repeat projection exposure apparatus of the first embodiment in that it is additionally provided with a diaphragm drive unit 21 for limiting the illuminated area, a reticle drive unit 22 and a wafer drive unit 23. Other components are the same as those of the first embodiment.

In order to control the length s of the illuminated area in the scanning direction for the purpose of controlling the amount of exposure, it will suffice to control the length of the aperture by moving the diaphragm 6. In order to control illuminance I for the purpose of controlling the amount of exposure, it will suffice to control either the power introduced to the light source 1 or the transmittance of the beam attenuating unit 18 provided in the optical path. Examples of the beam attenuating unit 18 are a beam attenuator having optical members of different transmittances disposed on a turret so that transmittance may be varied by selecting these optical members, or a beam attenuator in which transmittance is varied by changing the angle of a mirror the transmittance whereof differs depending upon the angle formed with the optical axis. Further, in order to control the scanning speed v, it will suffice to control the driving speeds of the diaphragm drive unit 21, reticle drive unit 22 and wafer drive unit 23.

The components for controlling the amount of exposure indicated in the second and third embodiments can also be used in the control of the amount of exposure in the scanning-type projection exposure apparatus.

The present invention is characterized in that the amount of exposure measured in order to control the amount of exposure during exposure is the amount of exposure not on the optical axis but off the optical axis at a position substantially conjugate with the substrate. Accordingly, if a program for controlling the amount of exposure carries out control based upon the off-optical-axis amount of exposure at a position substantially conjugate with the substrate, then all such techniques fall within the scope of the present invention.

<Embodiment of Device Manufacturing Method>

Described next will be an embodiment of a process for producing a semiconductor device utilizing the exposure apparatus set forth above.

Figure 12:
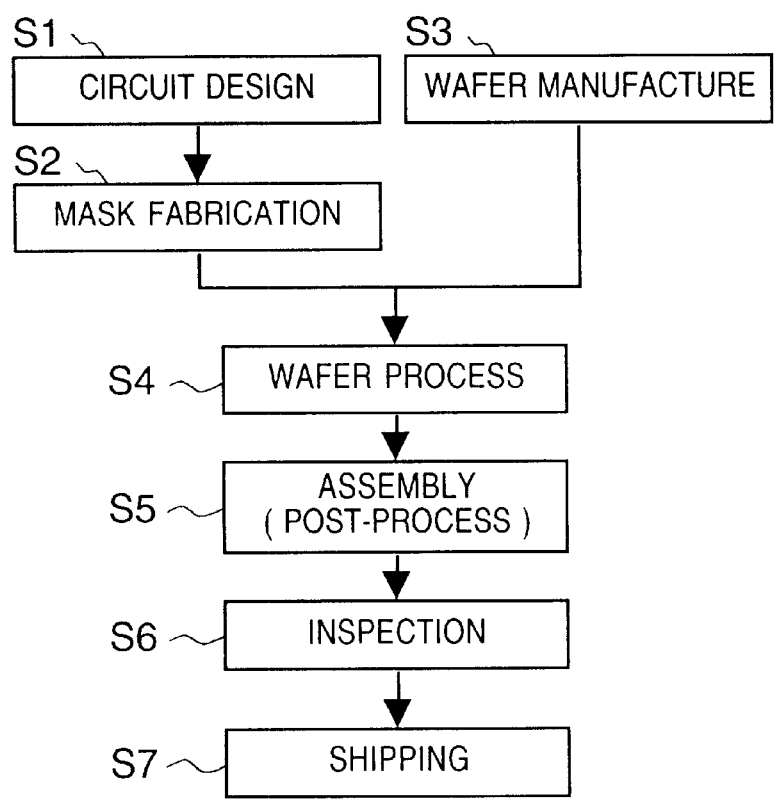
FIG. 12 is a flowchart illustrating a device manufacturing method which utilizes the exposure apparatus according to the present invention.

FIG. 12 illustrates the flow of manufacture of a semiconductor device (a semiconductor chip such as an IC or LSI chip, a liquid crystal panel, a CCD, a thin-film magnetic head, a micromachine, etc.). The circuit for the semiconductor device is designed at step 1 (circuit design). A mask on which the designed circuit pattern has been formed is fabricated at step 2 (mask fabrication). A wafer is manufactured using a material such as silicon or glass at step 3 (wafer manufacture). The actual circuit is formed on the wafer by lithography, using the mask and wafer that have been prepared, at step 4 (wafer process), which is also referred to as a "pre-process". A semiconductor chip is obtained, using the wafer fabricated at step 4, at step 5 (assembly), which is also referred to as a "post-process". This step includes steps such as actual assembly (dicing and bonding) and packaging (chip encapsulation). The semiconductor device fabricated at step 5 is subjected to inspections such as an operation verification test and durability test at step 6 (inspection). The semiconductor device is completed through these steps and then is shipped (step 7).

Figure 13:
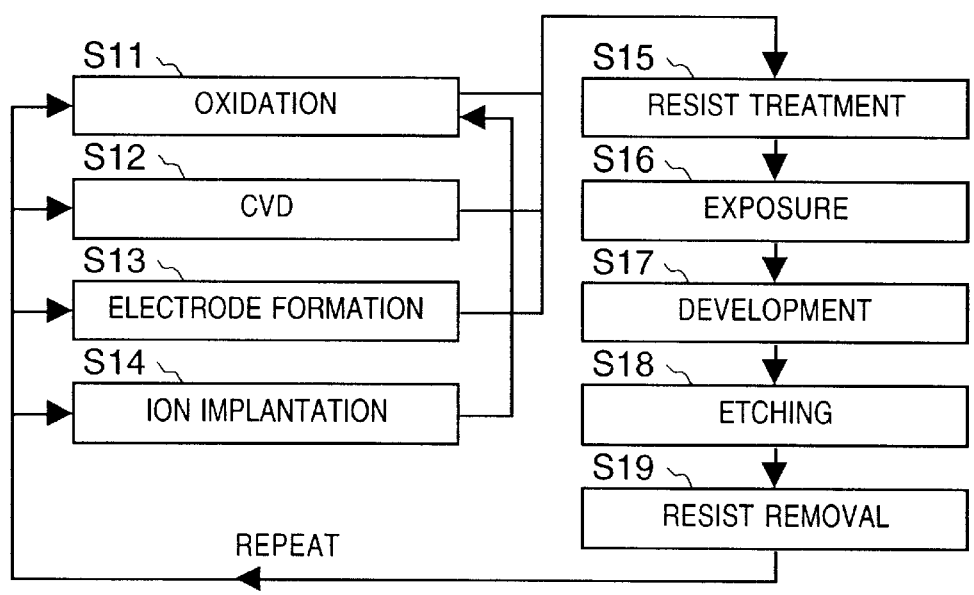
FIG. 13 is a flowchart showing the details of a wafer process depicted in FIG. 12.

FIG. 13 is a flowchart illustrating the detailed flow of the wafer process mentioned above. The surface of the wafer is oxidized at step 11 (oxidation). An insulating film is formed on the wafer surface at step 12 (CVD), electrodes are formed on the wafer by vapor deposition at step 13 (electrode formation), and ions are implanted in the wafer at step 14 (ion implantation). The wafer is coated with a photoresist at step 15 (resist treatment), the wafer is exposed to the circuit pattern of the mask to print the pattern onto the wafer by the above-described projection exposure apparatus at step 16 (exposure), and the exposed wafer is developed at step 17 (development). Portions other than the developed photoresist are etched away at step 18 (etching), and unnecessary resist left after etching is performed is removed at step 19 (resist removal). Multiple circuit patterns are formed on the wafer by implementing these steps repeatedly.

If the production process of this embodiment is employed, semiconductor devices having a high degree of integration can be manufactured at low cost. Manufacture of such semiconductor devices using the prior-art techniques was difficult.

In accordance with the present invention, the position at which the amount of exposure is measured for the purpose of controlling the amount of exposure is made at a position substantially conjugate with an off-optical-axis position in the illuminated area on a substrate. This makes it possible to reduce the space occupied by the components used to measure the amount of exposure.

As many apparently widely different embodiments of the present invention can be made without departing from the spirit and scope thereof, it is to be understood that the invention is not limited to the specific embodiments thereof except as defined in the appended claims.

What is claimed is:

1. A method of controlling an amount of exposure, said method comprising:
   when a pattern on a reticle is illuminated by illuminating light from a light source so as to be projected onto a substrate, an amount of light at a position substantially conjugate with a projected area on the substrate is measured and an amount of exposure applied to the substrate is controlled based upon a result of this measurement,
   wherein the position at which the amount of light is measured is a position substantially conjugate with an off-optical-axis position in the projected area on the substrate.

2. The method according to claim 1, wherein the position substantially conjugate with the off-optical-axis position resides on an optical path to which the illuminating light is diverted by a half-mirror placed in the optical path of the illuminating light.

3. The method according to claim 1, wherein the position substantially conjugate with the off-optical-axis position resides on an optical path to which the illuminating light is diverted by a lens, which is convex on the side of the light source, placed in the optical path of the illuminating light.

4. The method according to claim 1, wherein the position substantially conjugate with the off-optical-axis position resides on a diaphragm, which controls the projected area on the substrate, at a position substantially conjugate with the projected area.

5. The method according to claim 1, further including the steps of:

finding, before the substrate is subjected to exposure by projection, a relationship between the amount of light at the position conjugate with the off-optical-axis position and an amount of exposure on the substrate on the optical axis; and controlling the amount of exposure using this relationship when the substrate is subjected to exposure by projection.

6. The method according to claim 1, further including the steps of:

finding, before the substrate is subjected to exposure by projection, a relationship between the amount of light at the position conjugate with the off-optical-axis position and an amount of exposure on the substrate on the optical axis; and controlling the amount of exposure upon taking into account this relationship as well as unevenness in illuminance in the projected area on the substrate when the substrate is subjected to exposure by the projection.

7. The method according to claim 1, further including the steps of:

finding, before the substrate is subjected to exposure by projection, a relationship between the amount of light at the position conjugate with the off-optical-axis position and an amount of exposure in the projected area on the substrate at a position off the optical axis; and controlling the amount of exposure using this relationship when the substrate is subjected to exposure by projection.

8. The method according to claim 1, further including the steps of:

finding, before the substrate is subjected to exposure by projection, a relationship between the amount of exposure at the position conjugate with the off-optical-axis position and an amount of exposure in the projected area on the substrate at a position off the optical axis; and controlling the amount of exposure upon taking into account this relationship as well as unevenness in illuminance in the projected area on the substrate when the substrate is subjected to exposure by projection.

9. The method according to claim 1, further including the steps of:

finding, before the substrate is subjected to exposure by projection, a relationship between the amount of exposure at the position conjugate with the off-optical-axis position and an amount of exposure on the substrate at a predetermined position; and controlling the amount of exposure using this relationship when the substrate is subjected to exposure.

10. The method according to claim 1, further including the steps of:

finding, before the substrate is subjected to exposure by projection, a relationship between the amount of exposure at the position conjugate with the off-optical-axis position and an amount of exposure on the substrate at a predetermined position; and controlling the amount of exposure upon taking into account this relationship as well as unevenness in illuminance in the projected area on the substrate when the substrate is subjected to exposure by projection.

11. The method according to claim 1, wherein the position at which the amount of light is measured is only a position substantially conjugate with an off-optical-axis position in the projected area on the substrate.

12. An exposure apparatus comprising:

projection exposure means for illuminating a pattern on a reticle by illuminating light from a light source so as to project the pattern onto a substrate;

exposure measurement means for measuring an amount of light at a position substantially conjugate with a projected area on the substrate; and exposure control means for controlling an amount of exposure of the substrate based upon a result of this measurement, wherein said exposure measurement means measures the amount of light at a position, which is offset from the optical axis, substantially conjugate with the substrate and said exposure control means controls the amount of exposure of the substrate.

13. The apparatus according to claim 12, wherein said exposure measurement means and said exposure control means have an optical sensor for measuring the amount of light.

14. The apparatus according to claim 12, wherein said projection exposure means is a scanning-type projection exposure means which, while a portion of the reticle pattern is being projected onto the substrate, scans the reticle and the substrate synchronously to thereby scanningly project the reticle pattern onto the substrate.

15. The apparatus according to claim 12, wherein the position at which the amount of light is measured is only a position substantially conjugate with an off-optical-axis position in the projected area on the substrate.

16. A device manufacturing method for manufacturing a device, said method comprising:

illuminating a pattern on a reticle by illuminating light so as to project the pattern upon a substrate, wherein when exposure by projection of the illuminating light is performed, an amount of light at a position substantially conjugate with a projected area on the substrate is measured and an amount of exposure of the substrate is controlled based upon a result of this measurement, wherein said controlling step comprises controlling the amount of exposure of the substrate upon measuring the amount of light at a position, which is offset from the optical axis, substantially conjugate with the substrate.

17. The method according to claim 16, wherein the position at which the amount of light is measured is only a position substantially conjugate with an off-optical-axis position in the projected area in the substrate.

* * * * *